United States Patent [19]

Wakabayashi et al.

[11] Patent Number: 5,424,173
[45] Date of Patent: Jun. 13, 1995

[54] ELECTRON BEAM LITHOGRAPHY SYSTEM AND METHOD

[75] Inventors: Hiroaki Wakabayashi, Kodaira; Osamu Suga, Kokubunji; Yoshinori Nakayama, Sayama; Shinji Okazaki, Urawa, all of Japan

[73] Assignee: Hitachi, Ltd., Tokyo, Japan

[21] Appl. No.: 158,820

[22] Filed: Nov. 26, 1993

Related U.S. Application Data

[63] Continuation of Ser. No. 783,537, Oct. 28, 1991, abandoned, which is a continuation of Ser. No. 563,441, Aug. 7, 1990, Pat. No. 5,097,138.

[30] Foreign Application Priority Data

Aug. 7, 1989 [JP] Japan ................. 1-202854

[51] Int. Cl.$^6$ .............................................. G03F 7/20
[52] U.S. Cl. ............................... 430/296; 430/942; 250/492.3
[58] Field of Search .................. 430/301, 296, 942; 250/492.1, 492.2, 492.3

[56] References Cited

U.S. PATENT DOCUMENTS

| | | | |
|---|---|---|---|
| 4,158,140 | 6/1979 | Nakasuji | 250/306 |
| 4,213,053 | 7/1980 | Pfeiffer | 250/398 |
| 4,520,269 | 5/1985 | Jones | 430/296 |
| 4,698,509 | 10/1987 | Wells | 250/398 |
| 4,812,962 | 3/1989 | Witt | 430/296 |

FOREIGN PATENT DOCUMENTS 60-66429  4/1985  Japan ......................... 250/492.1

*Primary Examiner*—Kathleen Duda
*Attorney, Agent, or Firm*—Fay, Sharpe, Beall, Fagan, Minnich & McKee

[57] ABSTRACT

A system and method are provided for compensating for proximity effects between selected adjacent portions of pattern elements on an integrated circuit wafer where it is determined by simulation that undesirable resist patterns will result. The subject lithography system includes projecting an electron beam onto the wafer through an aperture plate of pattern elements to obtain the desired beam pattern. An aperture mask includes a plurality of first portions corresponding to first wafer circuit element portions spaced for avoiding proximity effects on the wafer and a plurality of second portions corresponding to second element portions spaced for obtaining proximity effects between elements on the wafer. The plurality of second portions are sized to have an increased adjacent spacing relative to a resultant adjacent spacing of the corresponding second element portions whereby the resultant adjacent spacing of the second element portions on the wafer is selectively reduced by the proximity effects. Alternatively, or in addition, a wire mesh is provided at the second portions of the aperture plate to reduce the beam intensity for corresponding reduction of the proximity effects.

18 Claims, 7 Drawing Sheets

ELECTRON BEAM LITHOGRAPHY SYSTEM AND METHOD

This is a continuation of application Ser. No. 07/783,537 filed Oct. 28, 1991, now abandoned which was a continuation of application Ser. No. 07/563,441, now U.S. Pat. No. 5,097,138 filed Aug. 7, 1990.

BACKGROUND OF THE INVENTION

1. Industrial Field

The present invention relates to electron beam lithography for use in producing large scale integrated circuits (LSIs), and is particularly applicable to a high-throughput electron beam lithography system and method capable of improving productivity while accomplishing a fine patterning ability.

2. Description of the Prior Art

LSI patterns are being formed in smaller, finer sizes and at higher degrees of integration than ever before, and it is further desired to realize patterning even finer than the resolution limit of light lithography employed thus far. Lithography that can satisfy this fine patterning desire has been achieved by electron beam lithography technology. However, known electron beam lithography technology has suffered from the problems of slow processing speed and poor productivity. One known technique for improving the productivity of such lithography technology, to obtain a higher throughput, is described in Japanese Patent Laid-Open No. 29981/1979, entitled "Electron Beam Irradiation Apparatus".

The basic concept of a high-throughput lithography method can be simply described by comparison with a conventional electron beam lithography method. FIG. 4 illustrates a lithography system and method based on a variable shaped technique which is a conventional electron beam lithography method. According to this lithography method, an electron beam 13 emitted like a shower from a gun 4 is shaped into a square form through a first aperture 5 having a square hole, and a square shaped beam 13' is focused on a second aperture plate 8' using a first lens 6 and a shaping deflector 7. The electron beam is formed into a square beam of any size by the second aperture plate 8' by adjusting the overlapping of the electron beam 13' and a square opening 14''. A square shaped beam 13'' that is formed is reduction-projected onto a predetermined position on a sample 12 while maintaining a precise focusing through a projection lens 9, a static deflector 10, and an objective lens 11. According to this conventional variable shaped lithography method, the pattern to be delineated is divided into squares of dissimilar sizes which are then delineated one by one. With the conventional method, therefore, even those patterns that are much repeated as shown, for example, on the sample 12 of FIG. 4 are all delineated by the same method. Accordingly, this conventional method requires a great number of beam "shots" and an extended period of time for lithography processing.

One way to improve the throughput is shown in FIG. 3, where desired lithography pattern elements 14' are formed in the second aperture plate 8 in advance. The electron beam 13' is shaped into pattern elements 14' and the pattern is delineated by repeating the cell projection of the thus shaped electron beams. The above lithography method makes it possible to greatly decrease the number of shots and to shorten the time for lithography processing. It is particularly effective for delineating memory LSIs such as DRAMs in which most of the patterns have periodicity, and makes it possible to increase the processing speed.

PROBLEMS TO BE SOLVED BY THE INVENTION

Despite a striking increase in the processing speed, however, the above aperture plate pattern lithography method still suffers from a serious problem. That is, proximity effects which are a problem specific to electron beam lithography.

This problem is best explained in detail with reference to FIGS. 2, 5 and 7. First, FIG. 7(a) illustrates electron beam lithography which desires to maintain a pattern gap $l_3$ on a resist film 20 on a silicon single crystalline substrate 19 using an electron beam 13''. A conductive underlayer 21, typically tungsten or aluminum, is interposed between the substrate and the resist film. The incident electrons from the beam are scattered in the resist film 20 and in the silicon substrate 19, and lose energy. Scattering occurs both in a forward and backward direction. Forward scattering results from dispersion through the resist film, while back scattering results from electron reflection from the conductive underlayer 21. Back scattering is typically a much larger component of the overall scattering, and increases when a heavier material underlayer is used, such as tungsten as opposed to aluminum. Therefore, energy is stored even in the regions that are not directly irradiated with the electron beam 13''. To more fully understand the proximity effect the following relationship must be known. When the position of an incident beam is denoted by y, the amount of energy stored at the position x is expressed as, $$E(x) = \int\int y \cdot F(||x-y||) d^2 y$$

where $F(\gamma) = c_1 \cdot \exp[-(\gamma/\delta_1)^2] + c_2 \cdot \exp[-(\gamma/\delta_2)^2]$. The first term ("$c_1$") represents forward scattering in the sample, and the second term ("$c_2$") represents the effect of back scattering. Symbols $c_1$, $c_2$, $\delta_1$ and $\delta_2$ denote constants determined by the resist material, thickness of the resist film, underlayer material, and electron beam accelerating voltage. For example, at a beam energy of 30 kV, for a plain silicon wafer with no underlayer $c_1$ is $2.73 \times 10^8$ and $c_2$ is $4.46 \times 10^5$, while with a tungsten underlayer the values are $c_1 = 2.77 \times 10^8$ and $c_2 = 1.75 \times 10^6$. FIG. 7(b) shows a distribution of energy storage amounts in the resist film 20 in accordance with the above relationship. In the resist film 20 irradiated with the electron beam, the stored amount of energy gradually decreases from near the silicon tungsten layer 21 toward the surface of the resist. Here, the lines of the same kinds represent portions where the stored amounts of energy are equivalent. In the case shown in FIG. 7(b), when it is intended to form a pattern without dissolution, the resist film of the electron beam lithography region must be developed such that the stored amount of energy whose distribution is indicated by a solid line will assume a threshold level. Curves of a dot-dash chain line and a dotted line shown in the non-irradiated region of FIG. 7(b) represent the stored amounts of energy in the non-irradiated region in the case when the stored amounts of energy are greater than the above threshold level. Therefore, a pattern is formed in the non-irradiated region too. This is the proximity effect which noticeably appears as the figures of the circuit pattern are brought closer to each other and which is inherent in electron beam lithography.

With particular reference to FIG. 2, repetitive patterns of a high density are shown to be formed by using an electron beam resist film. According to the conventional lithography method, the figures are delineated one by one. In order to avoid the proximity effect, therefore, the electron beam irradiation amount is finely adjusted during the lithography or the individual delineated figures are finely adjusted in order to decrease the storage of energy for the non-irradiated regions as shown above. When the above repetitive patterns are to be delineated by the cell projection method, however, an aperture pattern opening 14' (FIG. 3) in the second aperture 8 corresponding to the pattern elements 3 can be formed by one time of exposure by the lithography system that is shown in FIG. 3. When the projection is effected at one time by using the desired pattern opening 15 as is shown in FIG. 5, those portions not irradiated with the electron beam, but which are close to each other, after developing can undergo dissolution due to the pattern proximity effect. A resist pattern is then formed as shown in FIG. 6. Therefore, when etching patterns that tend to have strong proximity effects, such as the high-density patterns that are to be formed by the cell projection method, a serious problem exists because it becomes very difficult to form the patterns as desired.

The present invention provides a new and improved system and method of electron beam lithography that can employ a pattern opening and yet overcome the problems of proximity effects.

BRIEF SUMMARY OF THE INVENTION

In accordance with the present invention an electron beam lithography method and system are provided for projecting a desired preselected pattern of elements onto a wafer for production of integrated circuits thereon, wherein the system is particularly useful for compensating for proximity effects between selected adjacent portions of the preselected pattern of elements. An electron beam emits a shower onto the wafer that is focussed by a lens and aperture plate into a predetermined beam pattern corresponding to the preselected pattern of elements. The aperture plate includes a mask having a plurality of first portions corresponding to first element portions relatively spaced for avoiding proximity effects between elements on the wafer, and a plurality of second portions corresponding to second element portions relatively spaced for obtaining proximity effects between elements on the wafer, wherein the plurality of mask second portions are sized to have an increased adjacent spacing relative to resultant adjacent spacing of the corresponding second element portions, whereby the resultant adjacent spacing of the second element portions on the wafer is selectively reduced by the proximity effects.

The method and system is provided to estimate by simulation the undesirable dissolution of resist film caused by proximity effects in a pattern made with electron beam lithography, and adjustment of pattern sizing to maintain pattern element separation with minimum spacing. The method comprises calculation of stored energy due to forward and back scattering at selected points in the resist film that separate the delineated pattern. Where the stored energy at some of the selected points is determined to exceed the level that will substantially dissolve the resist film, adjacent pattern elements are adjusted in size in a pattern mask by an amount necessary to maintain sufficient resist film at those points. Pattern elements which are adjacent points where the stored energy is estimated to be too low to be sufficient to dissolve the resist are not adjusted.

In accordance with another feature of the invention, a fine wire mesh is included in the mask over only selected portions of the pattern elements to reduce the transmission density of the electron beam at those portions.

It is an object and benefit of the present invention that an electronic beam lithographic technique can be employed for a highly dense, periodically repeated cell pattern that compensates for resist film dissoluting due to proximity effects.

It is another object and benefit that pattern correction is achieved by adjusting only selected portions of the cell pattern that are estimated to have undesirable resist film dissolution.

It is yet another object and benefit that a repetitive and dense pattern can be delineated precisely and quickly by the simultaneous projection of a plurality of cells of the pattern for enhanced practicability and higher throughput.

Other benefits and advantages of the invention will become apparent to those skilled in the art upon a reading and understanding of this specification.

BRIEF DESCRIPTION OF THE DRAWINGS

FIG. 1 is a schematic diagram illustrating different embodiments of mask cell patterns for an electron beam lithography system made in accordance with the present invention, wherein

DETAILED DESCRIPTION OF THE PREFERRED EMBODIMENTS

Figure 1A:
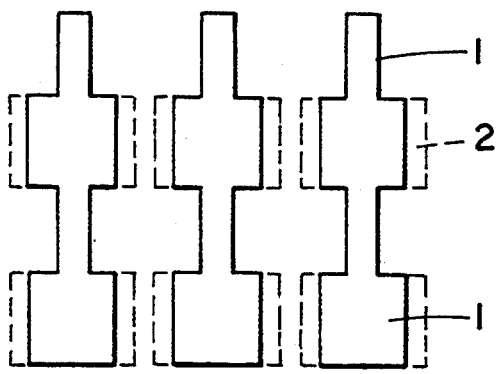
FIG. 1(A) shows a delineated pattern of a first embodiment.

Referring now to the drawings where the showings are for purposes of illustrating preferred embodiments of the invention only and not for purposes of limitation, the FIGURES show an assembly and method useful for projection of a plurality of repetitive cell elements in an electron beam lithographic technique to obtain a highly dense pattern in a high throughput production method.

Figure 3:
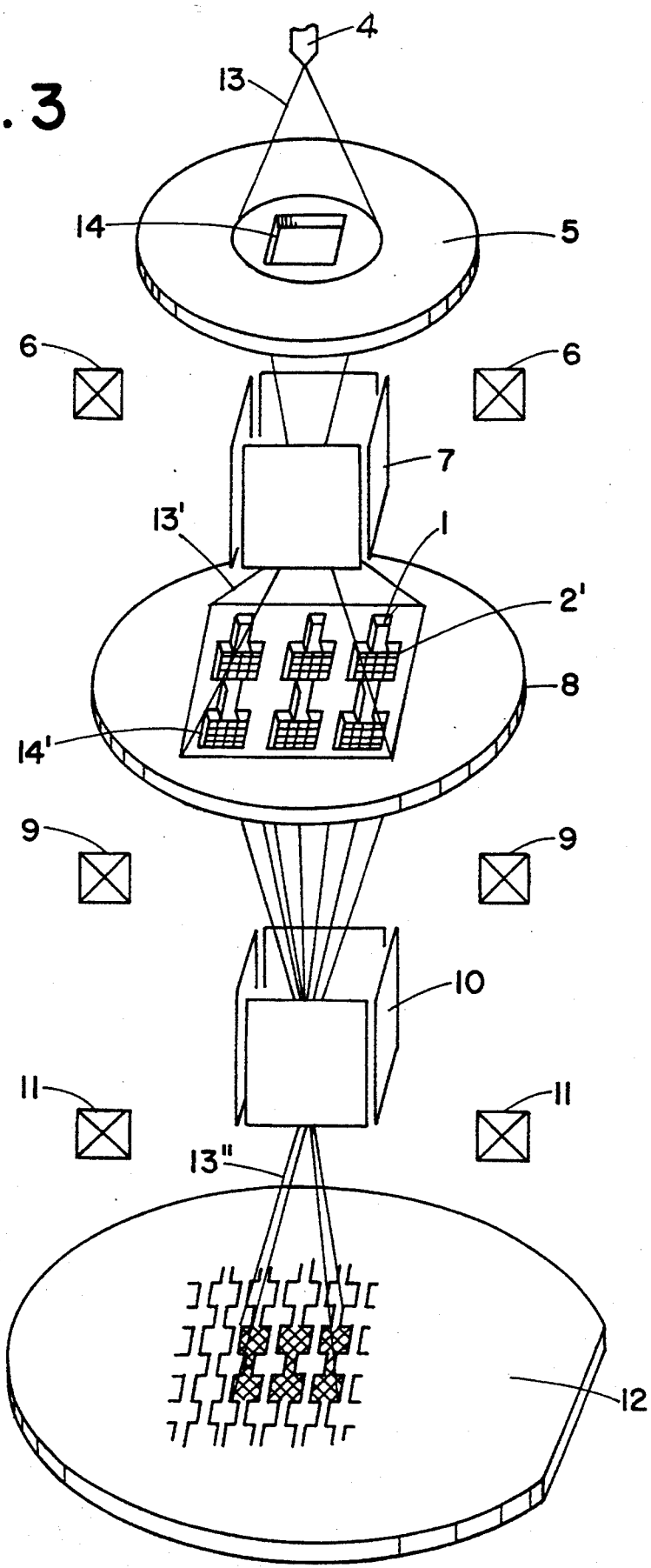
FIG. 3 is a schematic perspective view of a cell pattern projection assembly using an electron beam lithographic technique in accordance with the invention.
Figure 4:
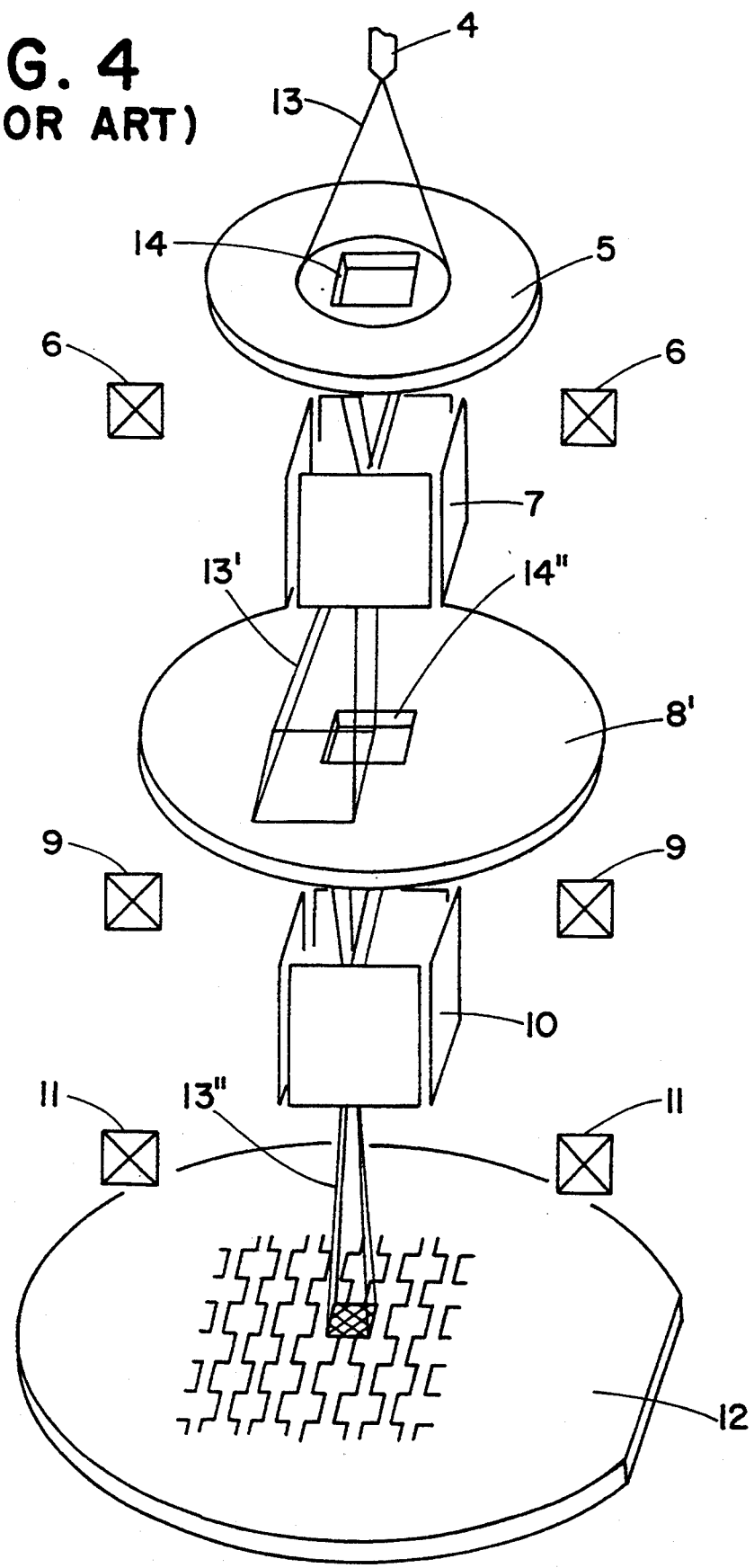
FIG. 4 is a schematic perspective view of a prior art electron beam lithography assembly.
Figure 5:
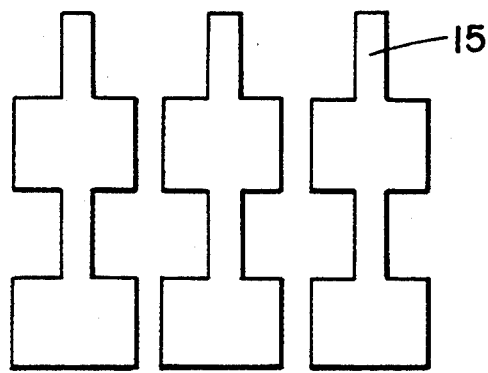
FIG. 5 is a view of a portion of a conventional cell pattern mask.
Figure 9:
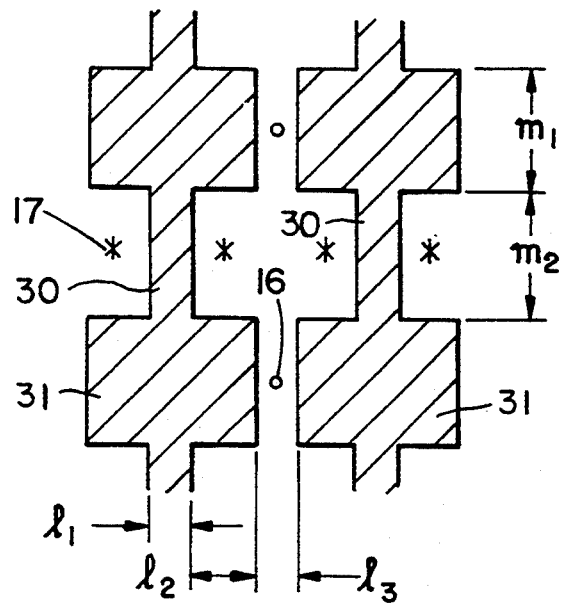
FIG. 9 is a schematic diagram showing a cell projection having the desired delineated figures and selected points for calculating the amounts of energy stored.

The over-all object of the invention is achieved by the electron beam lithography system which repeats the cell projection onto the surface of the wafer sample, where the system is provided in advance with means for correcting the proximity effects that develop among the repeated patterns on the surface of the sample. Specific steps for achieving this object will now be described in conjunction with FIGS. 9 and 10. First, what is shown in FIG. 9 is a part of a schematic diagram of a cell projection such as may be used in the mask pattern 14' (FIG. 3) for the desired preselected pattern of circuit elements corresponding to a delineated pattern of resist on the wafer. Here, symbols $l_1$, $l_2$, $l_3$, $m_1$ and $m_2$ in the drawings represent sizes of the delineated patterns indicated by the portions of crossing lines. Further, the points ○ 16 and points * 17 in the drawings represent portions where it is estimated that the proximity effect is likely to take place on the wafer delineated patterns, and are used as sampling points for calculating the stored amounts of energy. Using these sampling points, distribution of the amounts of energy stored in the resist film is found by simulation in the same manner as described above in detail, and the proximity effects among the patterns is estimated. It is found that the energy is not stored at the points * 17 in such amounts that affect the formation of the resist pattern but a resist pattern that is not expected is formed at the points ○ 16. In other words, first element portions 30 are determined to be relatively spaced for avoiding proximity effects between resist elements on the wafer when the stored energy is calculated for the points * 17, while second element portions 31 are calculated to obtain sufficient stored energy between them at points ○ 16 so that the proximity effects will affect the desired resist pattern.

Figure 10:
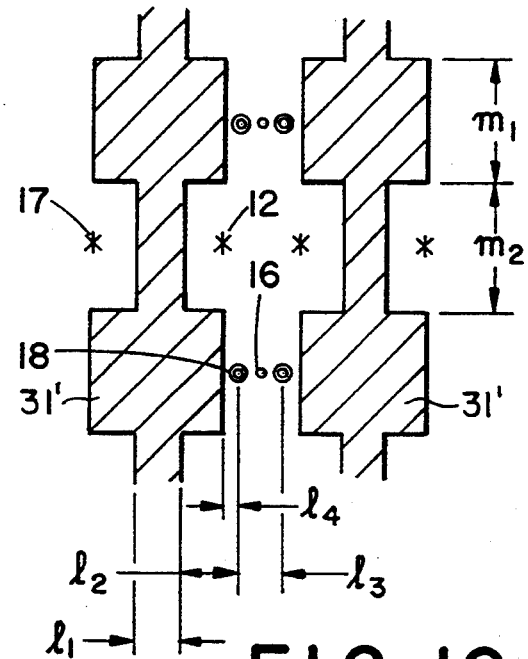
FIG. 10 is a schematic diagram showing a similar cell projection but adjusted in conformance with the invention and the selected points for calculating the amounts of energy stored.

It was therefore determined to form an adjusted resist mask pattern and simulate by calculation the stored energy when part of the mask portion is removed as shown in FIG. 10, and it was found that the resist pattern for the corresponding elements on the wafer could be formed as desired at the sampling points ⊙ 18 by the pattern proximity effects, but without permitting the formation of the resist pattern at the sampling points ○ 16. That is, the mask aperture 1 for shaping the electron beam for cell transfer to the wafer is formed in a shape as shown in FIG. 1(a), so that the delineated pattern 1, from which the figure of a size $l_4 \times m_1$ (FIG. 10) is removed in advance, is projected at one time. Here, the portions 2 shown by a broken line are the portions of the delineated figures removed for correcting the proximity effect. Thus, the aperture for focussing the beam is set so that first portions 30 remain unadjusted for proximity effects while second portions 31' (FIG. 10) are sized to have an increased adjacent spacing relative to what the resultant adjacent spacing of corresponding second element portions of resist 31 (FIG. 9) will be due to proximity effects.

Figure 1B:
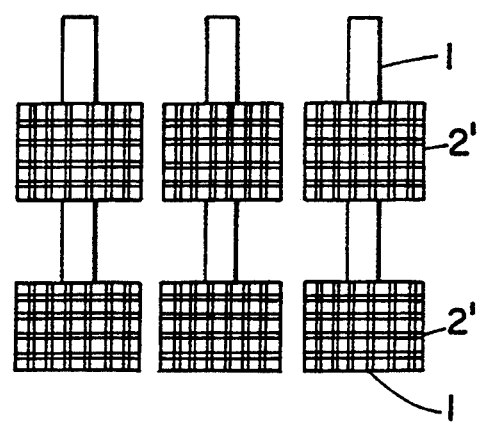
FIG. 1(B) shows the delineated pattern of a second embodiment.

Alternatively, the resist film portion that is estimated to easily develop proximity effect among the delineated patterns during the lithography can be adjusted by substantially decreasing the current density of the delineating irradiated electron beam for partly decreasing the amount of energy that is stored in that portion. As shown in FIG. 1B, for instance, a mesh 2' composed of fine wires having a size smaller than the resolution limit is provided at selected aperture portions that are expected to easily develop proximity effects among the delineated patterns. This method also makes it possible to selectively correct for proximity effects and to form the resist pattern as desired like the aforementioned case.

Figure 1C:
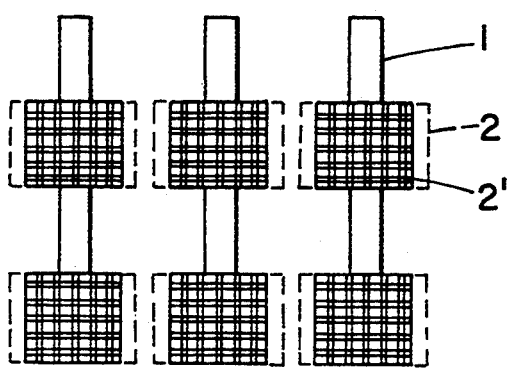
FIG. 1(C) shows the delineated pattern of a third embodiment.

Furthermore, as another alternative, the proximity effect can be corrected even more precisely by combining the removal of the appropriate portions of the pattern figures with the adjustment in the effective current density by the addition of the absorbing mesh as shown in FIG. 1C.

The detailed embodiments of the present invention will now be described in conjunction with the drawings.

First Embodiment

Figure 2:
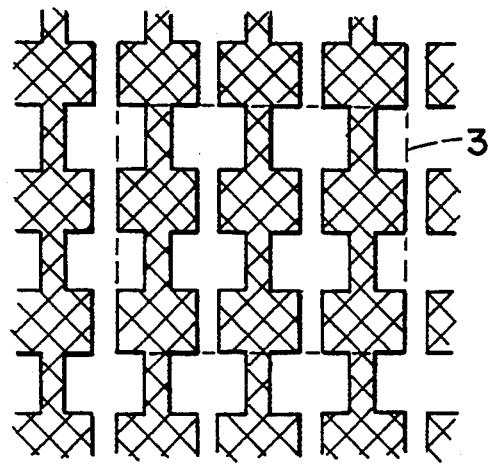
FIG. 2 is a schematic diagram showing an example of a projected periodic pattern that may be obtained in accordance with the above embodiments.
Figure 8:
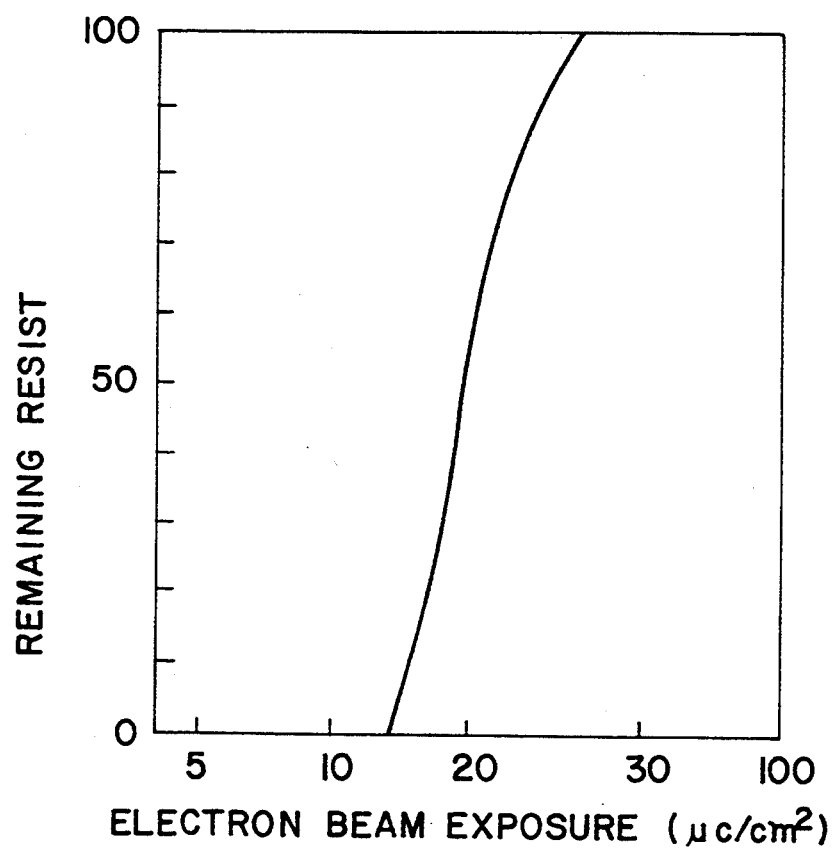
FIG. 8 is a diagram showing resist sensitivity characteristics.

This embodiment has a mask aperture equipped with a shaped pattern as shown in FIG. 1A in order to form a resist pattern that is shown in FIG. 2. The lithography system used for the lithography has the following specifications: an acceleration voltage of electron beam of 30 kV and a current density of 5 A/cm². Further, a negative resist RD-2000N (produced by Hitachi Kasei Co.) having a thickness of 0.5 $\mu$m is used as a resist film for forming a pattern on the wafer silicon substrate. The patterns are formed by the resist film using an alkali developing solution. FIG. 8 shows electron ray sensitivity characteristics of the resist film under the above-mentioned conditions. From FIG. 8, the resist pattern is formed with the shaped electron beam irradiation amount of 40 $\mu$C/cm². When the electron beam irradiation amount is smaller than 14 $\mu$C/cm², the resist is all dissolved by developing.

Figure 6:
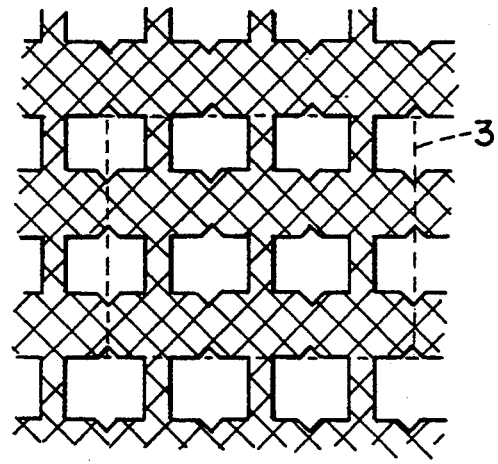
FIG. 6 is a view of a projected cell pattern that may be obtained with the mask of FIG. 5.
Figure 7A:
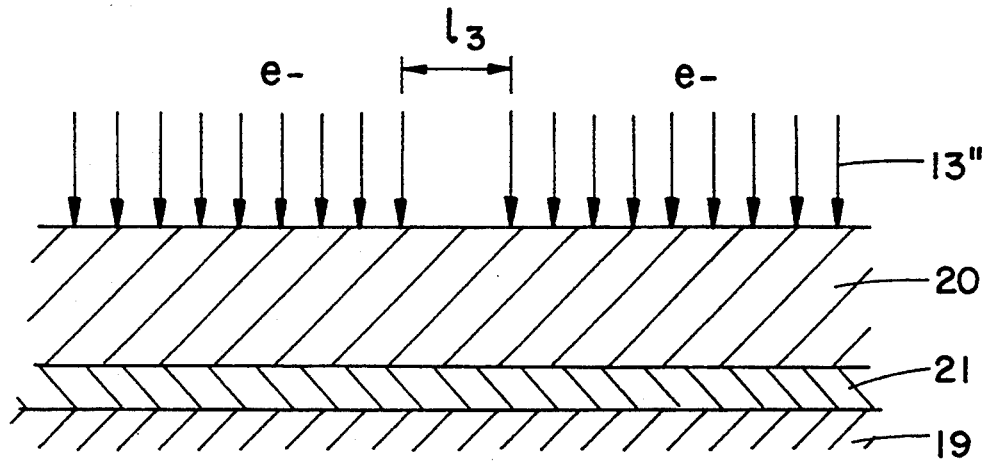
FIG. 7(A) is a drawing illustrating the application of beam energy to a resist film when a high-density cell pattern is being delineated.
Figure 7B:
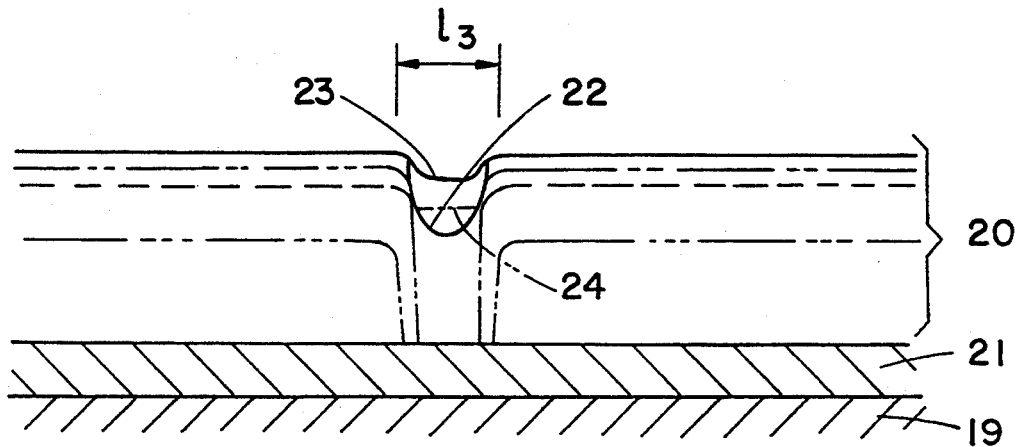
FIG. 7(B) shows a distribution of the amounts of energy stored in the resist film of FIG. 7(A)

FIG. 9 shows a portion of the desired delineated pattern. The pattern size is so defined that $l_1 = 0.4$ $\mu$m, $l_2 = 0.6$ $\mu$m, $l_3 = 0.4$ $\mu$m, $m_1 = 1.2$ $\mu$m, and $m_2 = 1.2$ $\mu$m. By taking the above lithography conditions into consideration, the anticipated amount of electric charge stored in the resist film when the pattern is delineated is found by calculation as discussed above. Points ○ 16 and points * 17 represent the portions where it is estimated that proximity effects easily takes place among the delineated patterns, and are used as calculation sampling points. As a result of the simulation, the amounts of energy stored at the sampling points ○ 16 and sampling points , 17 are found to be 30 $\mu$C/cm² and 12 $\mu$C/cm², respectively. From FIG. 8, it is estimated that the resist film is left by more than 90% of its thickness at the sampling points ○ 16 causing the pattern to be coupled together (FIG. 6), but the resist film is extinguished as desired at the sampling points * 17.

According to the present invention, therefore, portions 31' (FIG. 10) of the mask aperture are deformed as shown in FIG. 1 by reducing the sizing of the portions by the dimensions 2 so that the delineated pattern (FIG. 10) obtained by removing the region $l_4 \times m_1$ (where $l_4 = 0.2$ $\mu$m, $m_1 = 1.2$ $\mu$m) from the delineated pattern of FIG. 9 can be projected at one time according to the present invention. The aperture plate consists of a semiconductor single crystalline plate. In this embodiment, however, the patterning is effected by the customary method using a silicon single crystalline plate in order to form the pattern opening while maintaining high precision. In this case, it is confirmed by simulation that the amounts of energy stored at the sampling points ○ 16, * 17 and ⊙ 18 shown in FIG. 10 are 12 $\mu C/cm^2$, 12 $\mu C/cm^2$ and 30 $\mu C/cm^2$, respectively. In the practical formation of the resist pattern on the silicon single crystalline substrate, the high-density pattern as shown in FIG. 2 could be correctly formed maintaining a dimensional error of smaller than 9%.

Figure 11:
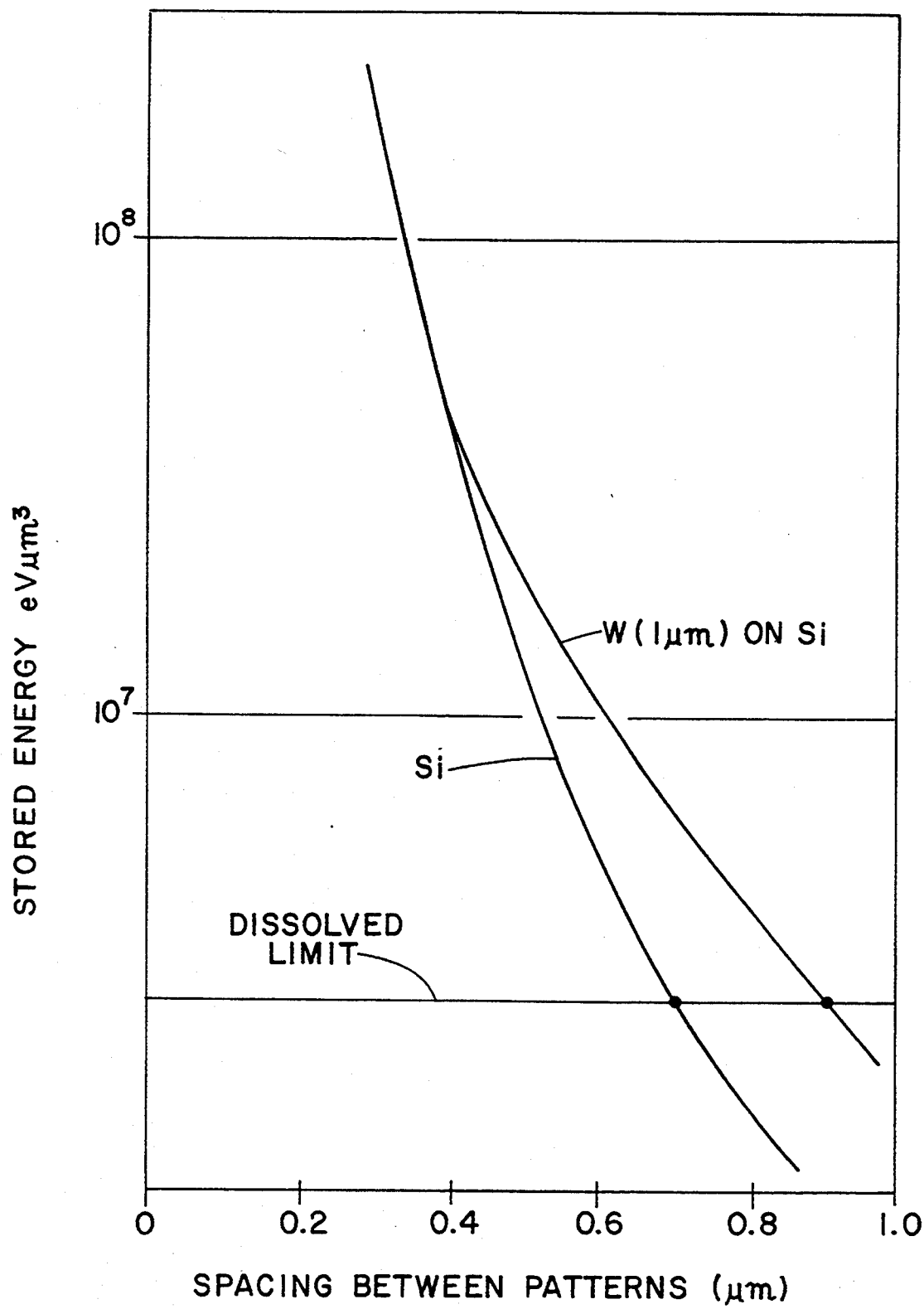
FIG. 11 is a graph showing the relationship between stored energy in a resist film portion and the spacing between projected cell elements bordering the resist; and, FIG. 12A is a graph showing the relationship between spacing of the elements in a mask and resulting spacing of projected cell elements on a Si wafer
Figure 12A:
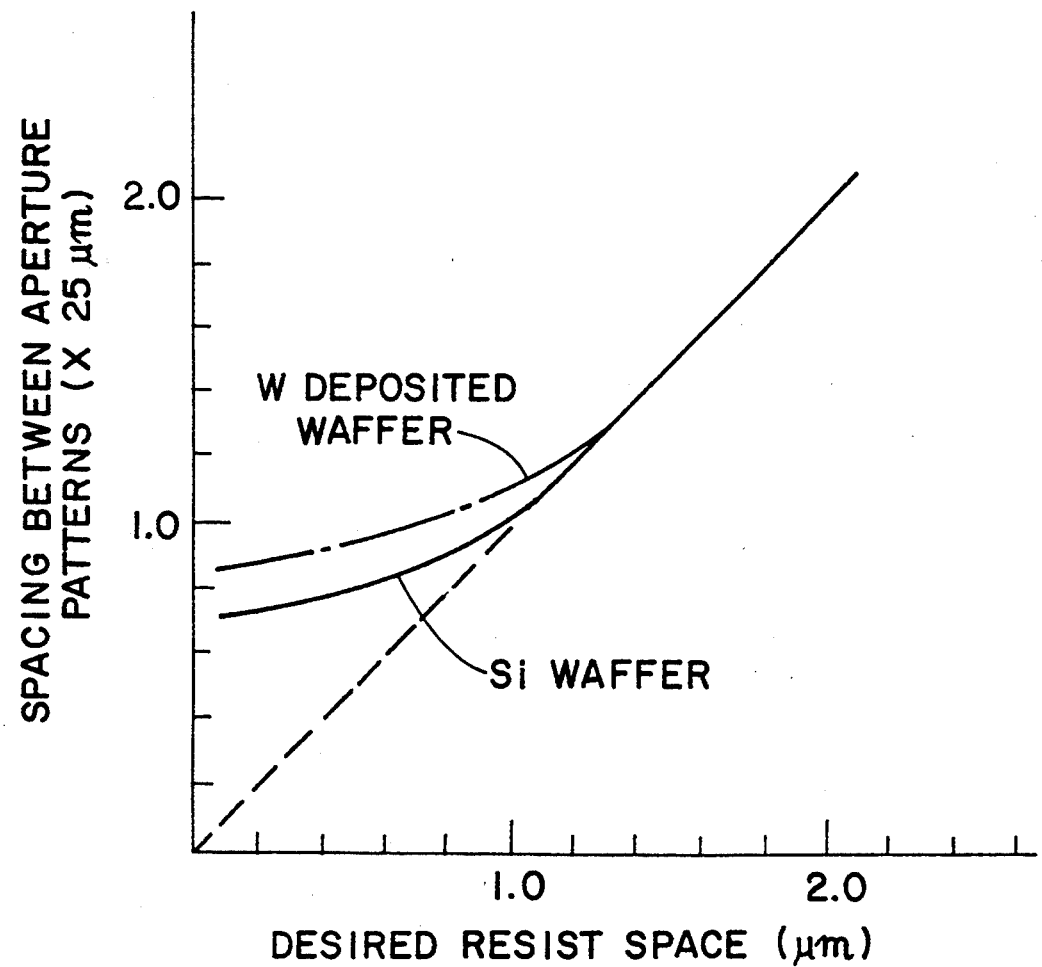
FIGS. 12B and 12C show the spacing between mask apertures and resulting element spacings on the wafer.
Figure 12B:
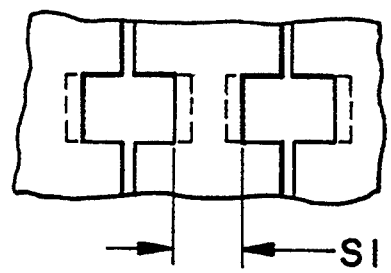
Figure 12C:
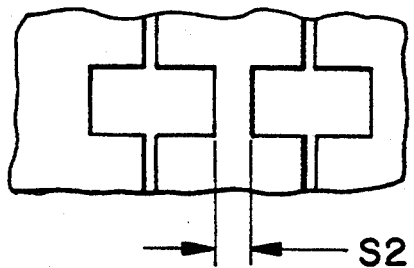

FIGS. 11 and 12 more particularly illustrate the relationships between stored energy and the necessary aperture spacings to obtain the desired resist spacings on the wafer. FIG. 11 shows the stored energy imparted by a 30 Kv beam on either a silicon wafer or one including the tungsten layer. The graph will of course change according to beam intensity. For silicon only the pattern spacing must be at least 0.7 $\mu m$, and for silicon and tungsten the pattern spacing must be at least 0.9 $\mu m$ to avoid the stored energy in the resist in the spacing receiving enough stored energy from proximity effects to exceed the dissolved limit. In FIG. 12A this relationship is further illustrated relative to the desired resist spacing where it is shown that for desired resist spacings of less than 1.4 $\mu m$ on a tungsten underlayer wafer the spacing between aperture patterns must be increased relative to the resist spacing. For such cases, FIG. 12B shows that the spacing between aperture patterns S1 will be greater than the resist spacing S2 (FIG. 12C) on the wafer.

Second Embodiment

Next, another embodiment of the electron beam lithography system of the present invention will be described in conjunction with FIG. 1B. Here, however, the specifications of the lithography system, the delineating and developing conditions such as the resist and developing solution, and the desired delineated pattern are the same as those of the aforementioned first embodiment.

In this embodiment as shown in FIG. 1B, a mesh 2' consisting of wires finer than a beam resolution limit is provided at selected portions of the aperture where it is expected that the proximity effects will occur among the patterns during the lithography. The fine wire used for the mesh 2' is a gold wire having a width of 2 $\mu m$. The contraction rate of the lithography system is 1/25, and it is confirmed that the metal wire pattern does not resolve when the resist pattern is being formed. In the opening fitted with the mesh 2', the density of the fine wire is so adjusted that the transmission density of the electron beam is decreased by 30%. The delineated pattern at this moment is shown in FIG. 9. It is confirmed by simulation that the amounts of energy stored at the sampling points ○ 16 and * 17 are 10 $\mu C/cm^2$ and 10 $\mu C/cm^2$, respectively. Even when the resist pattern is practically formed on the silicon single crystalline substrate, the high-density pattern shown in FIG. 2 can be highly precisely formed maintaining a dimensional error of smaller than 8% like in the first embodiment. It is a feature of this second embodiment that only selected portions of the mask aperture are provided with the mesh. These portions are determined according to the simulation calculations as identified in the practice of the first embodiment.

Third Embodiment

Next, a further embodiment of the electron beam lithography system according to the present invention will be described as a third embodiment in conjunction with FIG. 1C. The specifications of the lithography system, the delineating and developing conditions such as the resist and developing solution, and the desired delineated pattern are the same as those of the aforementioned embodiments.

In this embodiment, the aperture is deformed as shown in FIG. 1 based on the delineated pattern that is shown in FIG. 9, in order to project at one time the delineated pattern, shown in FIG. 10 that is obtained by removing the region $14 \times m_1$ (where $14 = 0.2$ $\mu m$ and $m_1 = 1.2$ $\mu m$) from the aperture where it is estimated that the proximity effects will occur among the patterns during the lithography. Furthermore, the deformed opening is also provided with a mesh 2' made of wires finer than the resolution. In the third embodiment shown in FIG. 1C, the fine wire used for the mesh 2' is a gold wire having a width of 2 $\mu m$. In this embodiment, the contraction rate of the lithography system is 1/25, and it has been confirmed that the gold wire pattern does not resolve when the resist pattern is being formed. In the opening fitted with the mesh, the density of the fine wire is so adjusted that the transmission density of the electron beam is decreased by 20%.

The delineated pattern at this moment is shown in FIG. 10. It is confirmed by simulation that the amounts of energy stored at the sampling points ○ 16, * 17 and ⊙ 18 are 5 $\mu C/cm^2$, 5 $\mu C/cm^2$ and 25 $\mu C/cm^2$, respectively. Even when the resist pattern is practically formed on the silicon single crystalline substrate, the high-density pattern shown in FIG. 2 can be highly precisely formed maintaining a dimensional error of smaller than 5% like in the aforementioned embodiments.

According to the electron beam lithography system of the present invention which repeats the cell transfer using the electron beam formed into any shape as described in the foregoing, provision is made for correcting the proximity effect that develops among the patterns. Therefore, when the individual patterns that are highly densely and periodically repeated, are to be delineated, a desired pattern can be delineated at high speeds maintaining high precision using the lithography system which is based on the very effective cell projection method and the lithography method. It is therefore made possible to greatly enhance the practicability of the electron beam lithography system and the lithography method.

The second aperture fitted to the lithography system of the present invention is chiefly composed of a semiconductor single crystal and, particularly, a single silicon crystal, enabling the pattern opening to be machined with high precision.

Having thus described the invention, I claim:

1. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the elements caused by the projection, the method comprising:

emitting the electron beam in a one-time projection, and shaping the beam by the aperture pattern in the aperture plate onto the wafer;

focusing the shaped beam into a predetermined beam pattern corresponding to the desired pattern of elements, wherein the beam pattern includes a plurality of first portions corresponding to first element portions relatively spaced to avoid proximity effects between said elements is projected on the wafer, and a plurality of second portions corresponding to second element portions of a different size than said first portions; and, selectively sizing the plurality of second beam pattern portions to have a different adjacent size and spacing as compared to a corresponding resultant adjacent size and spacing of the corresponding second element portions, so that the different adjacent spacing of the second beam pattern portions selectively reduces the proximity effects caused by the one-time projection.

2. The method as claimed in claim 1, further including disposing an absorbing material in operative association with the plurality of second beam pattern portions, wherein the absorbing material is under the resolution limit for reducing the beam effective electric current density at the second element portions on the wafer to reduce the proximity effects therebetween caused by the one-time projection.

3. The method as claimed in claim 1, further comprising calculating stored energy due to forward and back scattering at selected points between the selected adjacent portions, including simulating of an undesired development of elements due to proximity effects.

4. The method as claimed in claim 3, further including determining the stored energy at the selected points that exceeds a level that will substantially dissolve a resist film for the undesired development.

5. The method as claimed in claim 4, wherein the selective sizing occurs at the selected points that exceed the level for the undesired development.

6. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the elements caused by the projection, the method comprising:

emitting the electron beam in a one-time projection, and shaping the beam by the aperture pattern in the aperture plate onto the wafer;

focusing the shaped beam into a predetermined beam pattern corresponding to the desired pattern of elements, wherein the beam pattern includes a plurality of first portions corresponding to first element portions those relative spacing is sufficiently great so that the first element portions are not susceptible to proximity effects caused by the one-time projection that do not suffer from proximity effects caused by the one-time projection and a plurality of second portions corresponding to second element portions whose relative spacing makes the second element portions susceptible to proximity effects caused by the one-time projection that suffer from proximity effects between elements on the wafer; and, disposing an absorbing material in association with the plurality of mask second portions where proximity effects will cause dissolution of the second element portions wherein the absorbing material is under the resolution limit for reducing the beam effective electric current density at the second element portions on the wafer to reduce the proximity effects therebetween caused by the one-time projection.

7. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the elements caused by the projection, the method comprising:

emitting an electron beam in a one-time projection through the aperture plate for shaping the beam by the aperture pattern in the aperture plate onto the wafer; and, focusing the beam into a predetermined beam pattern corresponding to the preselected pattern of elements through the aperture plate having a plurality of aperture portions corresponding to a plurality of element portions of the preselected pattern, wherein the aperture portions are relatively spaced to reduce proximity effects between element portions on the wafer by increased adjacent spacing of the corresponding element portions, whereby the resultant adjacent spacing of the element portions on the wafer selectively reduces the proximity effects.

8. The electron beam lithography method as claimed in claim 7, including selectively sizing the aperture portions to obtain the resultant adjacent spacing of the corresponding element portions, wherein a combined pattern of the element portions and a plurality of second element portions comprise the desired preselected pattern of elements on the wafer.

9. The electron beam lithography method as claimed in claim 7, including disposing an absorbing material in the aperture plate, wherein the absorbing material is under the resolution limit for reducing the beam effective electron current density at the element portions on the wafer to reduce the proximity effects caused by the one-time projection.

10. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the preselected pattern of elements caused by the projection, the method comprising:

emitting an electron beam in a one-time projection, and shaping the beam by the selected aperture pattern in the aperture plate;

focusing the beam through an aperture plate into a predetermined beam pattern corresponding to the desired pattern of elements, wherein the aperture plate has a plurality of aperture portions corresponding to wafer element portions; and, disposing an absorbing material in operative association with the plurality of aperture portions where proximity effects will cause dissolution of the element portions, wherein the absorbing material comprises a size smaller than an under resolution limit for reducing the beam effective electric current density at the element portions on the wafer to reduce the proximity effects therebetween.

11. The electron beam lithography method as claimed in claim 10, wherein the plurality of aperture portions comprise open pattern portions disposed to pass the beam to the wafer.

12. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the elements caused by the projection, the method comprising:

emitting an electron beam in a one-time projection, and shaping the beam by the aperture in the aperture plate onto the wafer;

focusing the beam into a predetermined beam pattern corresponding to the desired pattern of elements, wherein the aperture plate has a plurality of first portions corresponding to first element portions on the wafer and a plurality of second portions corresponding to second element portions on the wafer and contiguous to the first portions wherein proximity effects occur between the first and second element portions as a result of the one-time projection; and, disposing an absorbing material in operative association with the plurality of aperture second portions where proximity effects will cause dissolution of the second element portions wherein the absorbing material is under the resolution limit for reducing the beam effective electric current density at the second element portions on the wafer to reduce the proximity effects therebetween.

13. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the elements caused by the projection, the method comprising:

emitting an electron beam in a one-time projection, and shaping the beam by the aperture pattern in the aperture plate onto the wafer; and, focusing the beam into a predetermined pattern corresponding to the preselected pattern of elements through the aperture plate having at least two element portions of the preselected pattern on the wafer upon a single emission of the electron beam and compensating the aperture portions to reduce the proximity effects between the selected adjacent element portions on the wafer.

14. The lithography method of claim 13, wherein the compensating includes reducing the size of selected aperture portions.

15. The lithography method of claim 13, wherein the compensating includes disposing an absorbing material for reducing the beam effective electric current density at selected aperture portions.

16. The lithography method of claim 13, wherein the selected aperture portions are contiguously disposed.

17. An electron beam lithography method for projecting a desired pattern of elements onto a wafer for production of integrated circuits using an aperture plate which has aperture patterns thereon from which to select an aperture pattern that is similar to the desired pattern of elements, wherein the method is particularly useful for compensating for proximity effects between selected adjacent portions of the preselected pattern of elements caused by the projection, the method comprising:

emitting the electron beam in a one-time projection and shaping the beam by the aperture pattern which includes a first portion corresponding to a first portion of the desired pattern and a second portion corresponding to a second portion of the desired pattern; and selectively sizing the second portion of the aperture pattern to reduce the proximity effects.

18. The method as claimed in claim 17, wherein the aperture pattern includes a first rectangular shaped portion and a second rectangular shaped portion, both portions being connected with each other, and the width of the first rectangular shaped portion is relatively narrower than that of the second rectangular shaped portion.

* * * * *